United States Patent [19]

Shimura

[11] Patent Number: 5,073,812
[45] Date of Patent: Dec. 17, 1991

[54] HETEROJUNCTION BIPOLAR TRANSISTOR

[75] Inventor: Teruyuki Shimura, Itami, Japan

[73] Assignee: Mitubishi Denki Kabushiki Kaisha, Japan

[21] Appl. No.: 481,619

[22] Filed: Feb. 20, 1990

[30] Foreign Application Priority Data

May 11, 1989 [JP] Japan .................................. 1-118194

[51] Int. Cl.$^5$ .................... H01L 29/72; H01L 29/161; H01L 23/48; H01L 27/02
[52] U.S. Cl. ........................................ 357/34; 357/16; 357/41; 357/67; 357/88
[58] Field of Search ............................ 357/16, 34, 67 S

[56] References Cited

U.S. PATENT DOCUMENTS

| | | | |
|---|---|---|---|
| 4,924,283 | 5/1990 | Ohshima | 357/16 |
| 4,929,997 | 5/1990 | Honjo et al. | 357/16 |
| 4,933,732 | 6/1990 | Katoh et al. | 357/16 |
| 4,958,208 | 9/1990 | Tanaka | 357/16 |
| 4,982,244 | 1/1991 | Kapoor | 357/67 |

OTHER PUBLICATIONS

Nagata et al., "Self-Aligned . . . Cap Layer", IEEE Transactions on Electron Devices, vol. ED-35, No. 1, Jan. 1988, pp. 2-7.

Morizuki et al., "Self-Aligned . . . Double Implantation"; Conference on Solid State Devices and Materials, Tokyo, 1986, pp. 359-362.

Primary Examiner—Andrew J. James
Assistant Examiner—Cynthia S. Deal
Attorney, Agent, or Firm—3lydig, Voit & Mayer

[57] ABSTRACT

A semiconductor device includes an n+ type InGaAs layer at a surface of the device, a refractory metal emitter electrode making ohmic contact to the n+ layer without alloying, and an externally accessible base region produced in the neighborhood of the emitter electrode by a diffusion using the emitter electrode and an insulating side wall film as a diffusion mask.

13 Claims, 6 Drawing Sheets (d)

(e)

(f)

(g)

HETEROJUNCTION BIPOLAR TRANSISTOR

FIELD OF THE INVENTION

The present invention relates to a semiconductor device and a production method therefor and, more particularly, to enhancing the efficiency and uniformity of the device.

BACKGROUND OF THE INVENTION

FIGS. 3(a) to 3(g) show a prior art production method for a HBT (hetero bipolar transistor).

In FIG. 3(a), reference numeral 1 designates a semi-insulating GaAs substrate. An n+ type GaAs layer 2 constituting a sub-collector layer having a thickness of about 5000 angstroms and impurity concentration of $5 \times 10^{18}$ cm$^{-3}$ is disposed on the substrate 1. An n type GaAs layer 3 constituting a collector layer having a thickness of about 5000 angstroms and impurity concentration of about $5 \times 10^{16}$ cm$^{-3}$ is disposed on the n+ type GaAs layer 2. A p- type GaAs layer 4 constituting a base layer having a thickness of about 1000 angstroms and impurity concentration of about $1 \times 10^{19}$ cm$^{-3}$ is disposed on the n type GaAs layer 3. Reference numeral 5a designates a grading layer between the p type GaAs layer 4 and an emitter layer 5, comprising n type Al$_x$Ga$_{1-x}$As layer where x gradually varies from 0 to 0.3 in the direction of emitter layer 5 having a thickness of about 500 angstroms and impurity concentration of about $3 \times 10^{17}$ cm$^{-3}$. An n type Al$_{0.3}$Ga$_{0.7}$As layer 5 constituting an emitter layer having a thickness of about 1000 angstroms and impurity concentration of about $3 \times 10^{17}$ cm$^{-3}$ is disposed on the grading layer 5a. Reference numeral 5b designates a grading layer between the emitter layer 5 and an emitter cap layer 6, comprising n type Al$_x$Ga$_{1-x}$As layer where x gradually varies from 0.3 to 0 in the direction of cap layer 6 having a thickness of about 500 angstroms and impurity concentration of about $3 \times 10^{17}$ cm$^{-3}$. An emitter cap layer 6 comprising n+ type GaAs having a thickness of about 2000 angstroms and impurity concentration of about $5 \times 10^{18}$ cm$^{-3}$ is disposed on the grading layer 5b.

In FIG. 3(b), reference numeral 7 designates an emitter electrode dummy pattern of a first insulating comprising SiON or SiN and having a film thickness of about 5000 angstroms. A p type external base region 8 is produced by ion implantation of Mg+ ions to a depth of about 3000 angstroms and impurity concentration of about $5 \times 10^{18}$ cm$^{-3}$.

In FIG. 3(c), reference numeral 9 designates a second insulating comprising SiO and having a film thickness of about 3000 angstroms. Reference numeral 10 designates an insulating region produced by ion implantation of B+ ions or H+ ions and having a depth of about 11000 angstroms.

In FIG. 3(d), reference numeral 11 designates a side wall which is produced by reactive ion etching (RIE) of the second insulating film 9.

In FIGS. 3(e) and 3(f), reference numeral 12 designates a base electrode resist pattern, and reference numerals 13 and 13a designate base electrode metal such as AuZn.

In FIG. 3(g), reference numeral 14 designates a first or second insulating film which is flattened using photoresist and uniform speed etching of the photoresist and the insulating film by RIE. Reference numeral 15 designates an emitter electrode such as a AuGe alloy.

The production process will be described.

The structure shown in FIG. 3(a) is produced by molecular beam epitaxy (MBE) or metal organic chemical vapor deposition (MOCVD).

Next, as shown in FIG. 3(b), a first insulating film comprising SiON or SiN is deposited on the entire surface of the structure shown in FIG. 3(a), and the insulating film is patterned by photolithography to produce a dummy pattern for emitter electrode 7. Then, the n+ GaAs layer (emitter cap layer) 6 is etched by wet etching using a solution of sulfuric acid, hydrogen peroxide, and water using the dummy pattern 7 as a mask.

Next, Mg+ ions are ion implanted using the first insulating film 7 as a mask, and an external base region 8 having a depth of about 3000 angstroms and impurity concentration of about $5 \times 10^{18}$ cm$^{-3}$ is produced.

In FIG. 3(c), the second insulating film 9 comprising SiO is deposited on the entire surface of wafer, and thereafter, B+ or H+ ions are ion implanted using a photoresist pattern as a mask. An insulating region 10 having a depth of about 11000 angstroms is produced.

As shown in FIG. 3(d), the second insulating film 9 comprising SiO is etched by RIE using a mixture of C$_2$F$_6$+CHF$_3$+O$_2$+He, whereby a side wall 11 is produced. When the second insulating film comprises SiN, the mixture of CHF$_3$+O$_2$ is used. Herein, the etching is conducted under conditions chosen so that the first insulating film 7 is not etched (conditions such as substrate temperature and mixing ratio of gas).

As shown in FIG. 3(e), a photoresist pattern 12 is deposited and a metal 13 such as AuZn is vapor deposited on the entire surface. Base electrodes 13a are produced using the photoresist pattern 12 and the first kind of insulating film 7 as a mask, separated from the emitter cap layer 6 with intervals corresponding to the thickness of the side wall 11.

As shown in FIG. 3(f), the photoresist pattern 12, the first insulating film 7, and the side wall 11 are removed by etching with hydrofluoric acid, and unrequired portions of metal 13 is also removed at the same time. Herein, reference numeral 40 designates a collector electrode.

As shown in FIG. 3(g), a first or second insulating film 14 is deposited on the entire surface, and a photoresist is deposited thereon to make the surface flat. Thereafter, equal speed etching of the photoresist and the insulating film 14 by RIE exposes the head portion of the emitter cap layer 6, thereby flattening the insulating film 14.

An emitter electrode metal 15 comprising a AuGe alloy is deposited on the exposed portion of the emitter cap layer 6.

In the prior art production method of an HBT, ion implantation of Mg+ ions is utilized to connect the base region to the surface and to produce a base electrode at the surface of the device.

In this ion implantation method, however, the impurity concentration of the external base region 8 is low, about $5 \times 10^{18}$ cm$^{-3}$ at the most, and it is impossible to reduce the external base resistance significantly.

While producing an emitter electrode, the surface flattening using photoresist and the exposure of the emitter cap layer utilizing the equal speed etching of the photoresist and insulating film by RIE exploit the step difference due to the emitter cap layer 6, and the reproducibility and uniformity of the process and product are poor.

The emitter cap layer 6 is an n⁻ GaAs layer and is required to have a step of about 2000 to 3000 angstroms. Further, this step is produced by wet etching. Therefore, the reproducibility and uniformity of the emitter width are poor due to the variations in the wet etching and, therefore, precision patterning of the emitter width is difficult.

When the base electrode 13a is spaced from the emitter at intervals equal to the thickness of the side wall, the spacing between the base electrode metal 13 and the emitter electrode dummy pattern 7 is difficult to control. This results in reductions in yield.

SUMMARY OF THE INVENTION

An object of the present invention is to provide a semiconductor device with reduced base resistance, precision emitter electrode, and enhanced speed and integration ability that has superior reproducibility and uniformity of results.

It is another object of the present invention to provide a method of producing such a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, an n⁻ type InGaAs layer is disposed at a surface of the device, so that an ohmic contact emitter electrode can employ a non-alloying refractory metal. Therefore, a narrow emitter electrode can be precisely patterned, enhancing the speed of the device and its integration density. Furthermore, since an external base region is self-aligningly produced using the emitter electrode and its side wall as a mask, the base resistance can be reduced, enhancing device performance is enhanced.

According to another aspect of the present invention, since flattening and exposure of the emitter electrode are carried by ECR CVD, a low resistance metal can be laminated on the refractory metal emitter electrode. Therefore, the emitter resistance can be reduced, enhancing device performance. Furthermore, since the flattening and exposure of the emitter electrode by ECR CVD, the later processes such as wiring are simplified, enhancing the integration density of the device.

DETAILED DESCRIPTION OF THE PREFERRED EMBODIMENTS

An embodiment of the present invention will be described in detail with reference to the drawings.

Figure 1A:
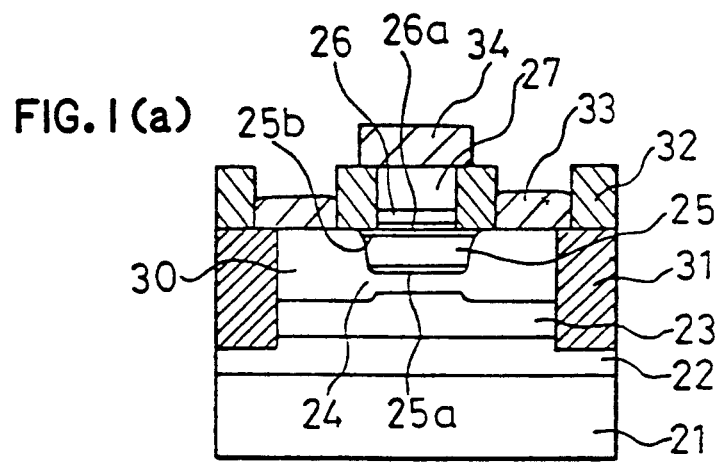
FIGS. 1(a) and 1(b) are a cross-sectional view and a plan view of a semiconductor device according to an embodiment of the present invention.
Figure 1B:
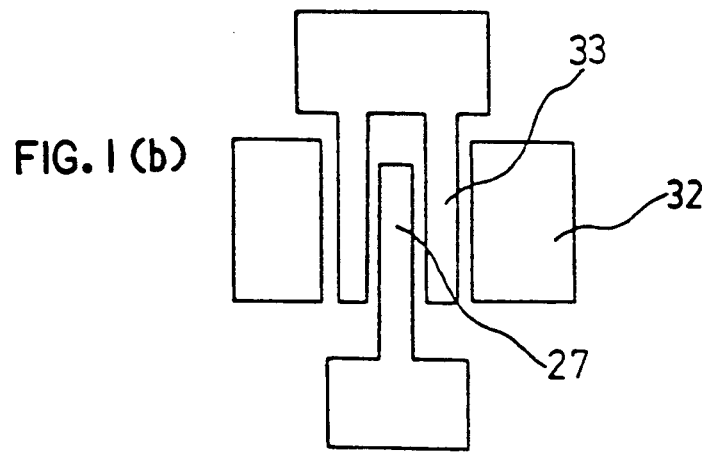

FIGS. 1(a) and 1(b) show a cross-sectional view and a plan view of an HBT according to an embodiment of the present invention, and FIGS. 2(a) to 2(g) illustrate a production process therefor.

In FIG. 1(a), reference numeral 21 designates a semi-insulating GaAs substrate. An n⁺ GaAs layer 22 constituting a sub-collector layer having a thickness of about 5000 angstroms and impurity concentration of about $5 \times 10^{18}$ cm⁻³ is disposed on the substrate 21. An n type GaAs layer 23 constituting a collector layer and having a thickness of about 5000 angstroms and impurity concentration of about $5 \times 10^{16}$ cm⁻³ is disposed on the n⁻ type GaAs layer 22.

A p⁺ type $Al_xGa_{1-x}As$ layer 24 where x gradually varies from 0 to 0.1 opposite layer 23 constituting a base layer and having a thickness of about 1000 angstroms and impurity concentration of about $1 \times 10^{19}$ cm⁻³ is disposed on the n type GaAs layer 23.

Reference numeral 25 designates an n type $Al_{0.3}Ga_{0.7}As$ layer constituting an emitter layer and having a thickness of about 1000 angstroms and impurity concentration of about $3 \times 10^{17}$ cm⁻³.

Reference numeral 25a designates an n type $Al_xGa_{1-x}As$ layer where x gradually varies from 0.1 to 0.3 opposite layer 25, constituting a grading layer between the base layer 24 and the emitter layer 25 and having a thickness of about 300 Angstroms and impurity concentration of about $3 \times 10^{17}$ cm⁻³.

Reference numeral 25b designates an n type $Al_xGa_{1-x}As$ layer where x gradually varies from 0.3 to 0 opposite layer 25, constituting a grading layer between the emitter layer 25 and an emitter cap layer 26 and having a thickness of about 300 angstroms and impurity concentration of about $3 \times 10^{17}$ cm⁻³.

Reference numeral 26 designates an n⁻ type $In_{0.5}Ga_{0.5}As$ layer constituting an emitter cap layer for producing an ohmic contact by non-alloying, having a thickness of about 500 angstroms and impurity concentration of about $2 \times 10^{19}$ cm⁻³.

Reference numeral 26a designates an n⁻ type $In_xGa_{1-x}As$ layer where x gradually varies from 0 to 0.5 opposite layer 25b constituting a grading layer between the emitter layer 25 and the emitter cap layer 26 and having a thickness of about 300 angstroms and impurity concentration of about $2 \times 10^{19}$ cm⁻³. Reference numeral 27 designates an emitter electrode comprising refractory metal such as W or WSi and having a thickness of about 3000 angstroms. Reference numeral 30 designates an external base region produced by diffusion of p type dopants such as Zn, having a depth of about 3000 angstroms and impurity concentration of about $2 \times 10^{19}$ cm⁻³.

Reference numeral 31 designates an insulating region produced by ion implantation of B⁺ or H⁺, having a depth of 10000 angstroms. Reference numeral 32 designates an insulating film produced by ECR CVD (Electron Cyclotron Resonance Chemical Vapour Deposition) for surface flattening and exposure of the emitter electrode 27.

Reference numeral 33 designates a base electrode comprising AuZn or Ti/Mo/Au serially deposited on the external base 30, and reference numeral 34 designates a low resistance metal such as Ti/Au disposed on the emitter electrode 27.

In FIGS. 2(a)-2(g), the same reference numerals designate the same or corresponding elements as those shown in FIG. 1. Reference numeral 28 designates an insulating film such as SiO disposed on the side surfaces of the emitter electrode 27 and on the emitter cap layer 26 comprising n⁻ type $In_{0.5}Ga_{0.5}As$.

Reference numeral 29 designates a doped oxide film such as $ZnO\ SiO_2$ having a Zn concentration of about 70% as a solid phase diffusion source.

The production process will be described.

Figure 2A:
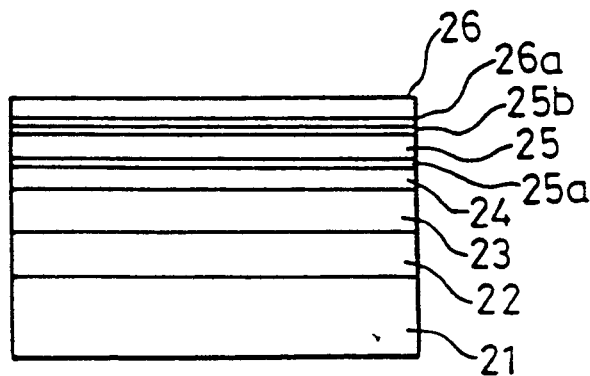
FIGS. 2(a) to 2(g) are cross-sectional views illustrating the process steps for producing a semiconductor device shown in FIG. 1(a)

First of all, the epitaxial growth structure shown in FIG. 2(a) is produced by MBE or MOCVD.

Figure 2B:
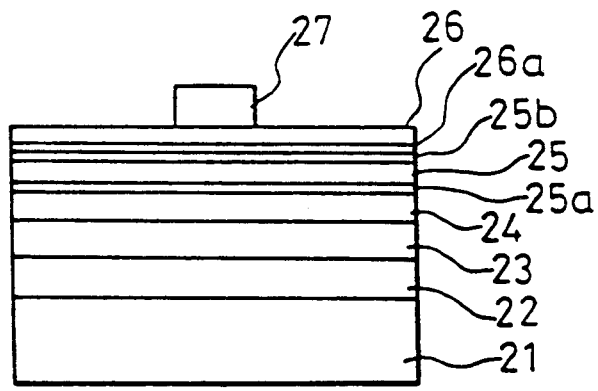

Next, as shown in FIG. 2(b), a refractory metal such as WSi is sputtered on the entire surface, and the sputtered film is etched by a reactive ion etching using a mixture of $CF_4+O_2$, thereby producing an emitter electrode 27 on the n⁺ type InGaAs layer 26.

Herein, since the concentration of the n⁻ type InGaAs layer 26 is high, for example, above $1\times10^{19}$ cm⁻³, even when a refractory metal such as WSi is used for the emitter electrode 27, it is possible to realize a low contact resistance without alloying, that is, without annealing.

Furthermore, because the emitter electrode 27 is produced by a sputtering and subsequent RIE technique, precise, narrow patterning is quite easy.

Figure 2C:
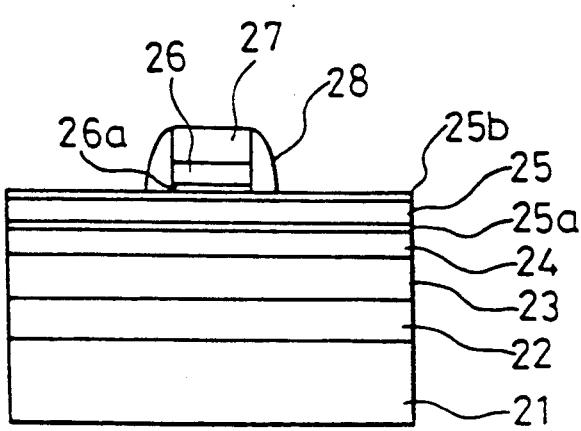
Figure 2:
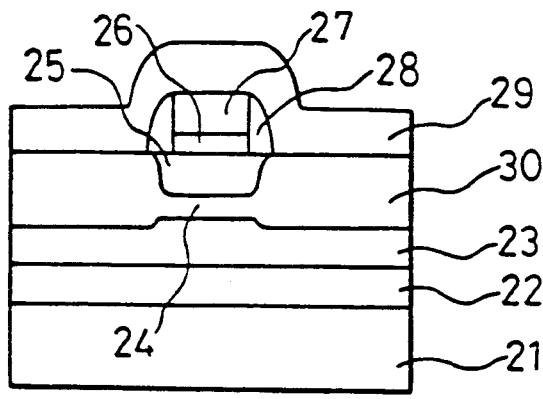
Figure 2:
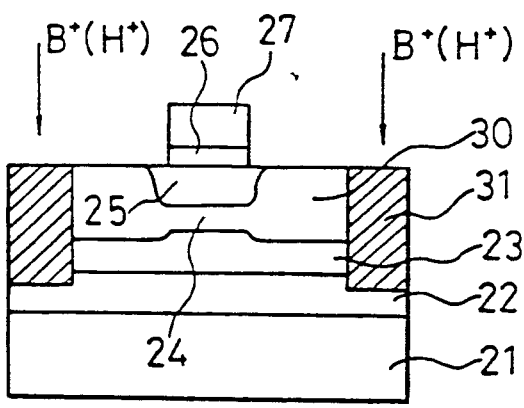
Figure 2:
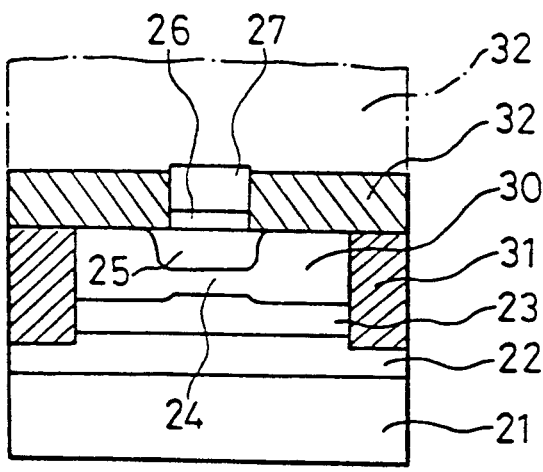
Figure 2:
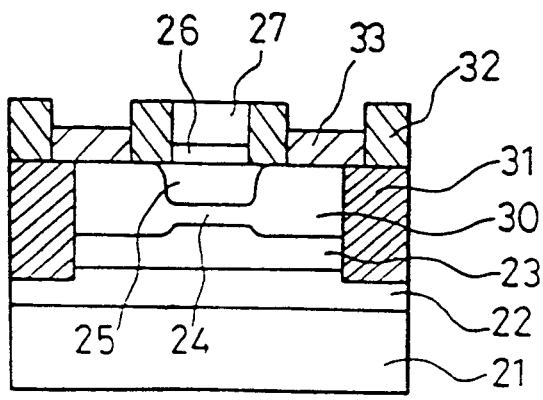
Figure 3A:
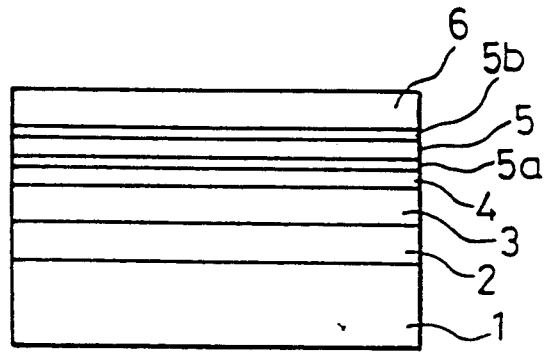
FIGS. 3(a) to 3(g) are cross-sectional views illustrating process steps for producing a semiconductor device according to the prior art.
Figure 3B:
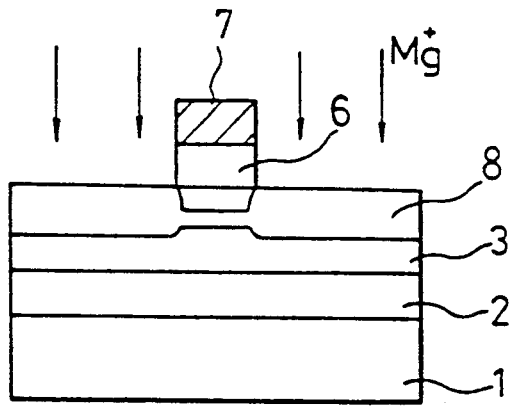
Figure 3C:
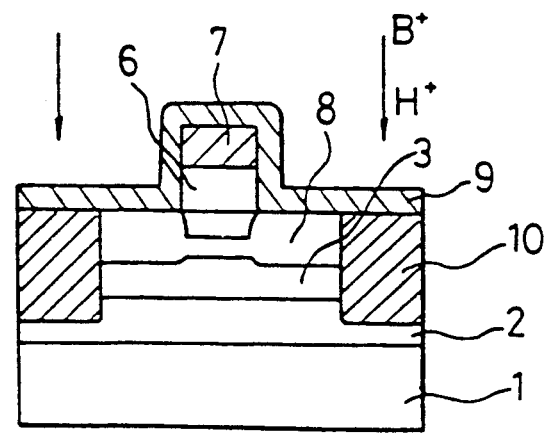
Figure 3D:
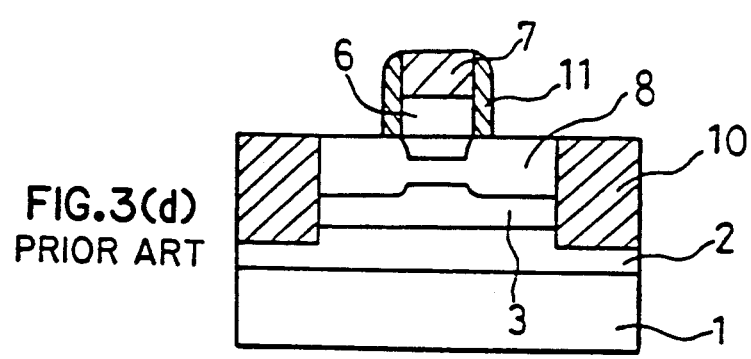
Figure 3E:
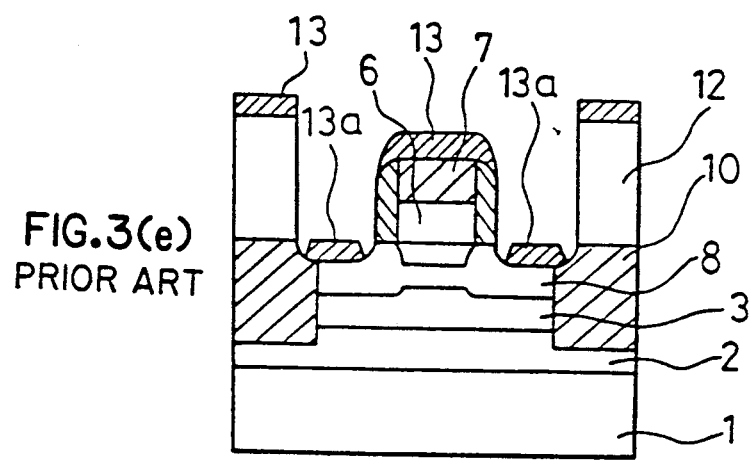
Figure 3F:
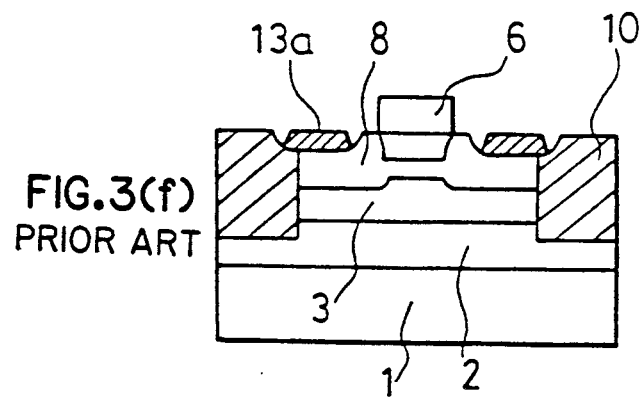
Figure 3G:
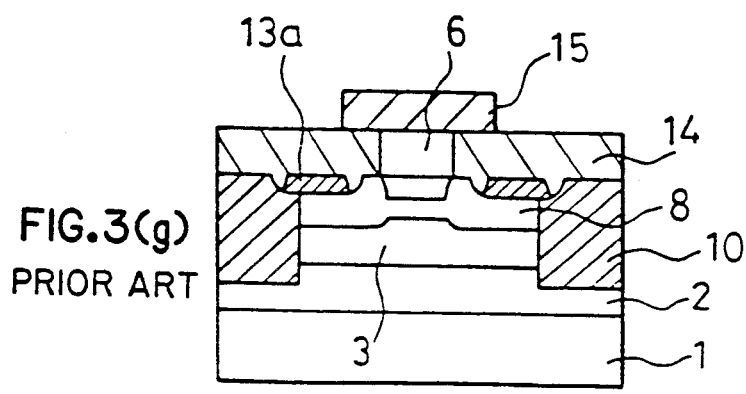

In FIG. 2(c), only the n⁻ InGaAs layer 26 at the upper surface is etched by wet etching or dry etching using a chlorine compound gas. When a wet etching is employed, by using concentrated HCl which is heated to about 60° C. as an etchant, the n⁻ type InGaAs layer 26 is selectively etched without etching the lower n type AlGaAs layer 25.

Next, a side wall 28 is produced at the side surfaces of the emitter electrode 27 and on the emitter cap layer 26. This can be realized by producing SiO on the entire surface and leaving the SiO only at the side surfaces of the emitter cap layer 26 and on the emitter electrode 27 by anisotropic etching such as RIE using a mixture of $C_2F_6+CHF_3+O_2+He$.

Herein, SiO is used for the side wall because it is difficult to deposit SiN. Because SiO sometimes is not effective as a diffusion mask, it is better to produce a SiN layer underlying a layer of SiO. This SiN underlying layer is patterned by RIE using a mixture of $CHF_3+O_2$.

In FIG. 2(d), a doped oxide such as $ZnO\ SiO_2$ 29 is deposited on the entire surface by a sputtering or the like.

Then, by annealing, p type dopants such as Zn are selectively diffused (solid phase diffusion) into the structure using the emitter electrode 27 and the side wall 28 as masks, thereby to produce an external base region 30. Herein, although it is not shown in the figure, double films consisting of SiO and SiN are disposed only where diffusion is not required. These double films are produced by the RIE technique during production of the side wall films.

The diffusion is carried out in a diffusion furnace at a temperature of 500° C. to 700° C. for tens of minutes. Then, since the emitter electrode 27 comprising a refractory metal such as WSi has a melting point above 1000° C., it will not melt during the diffusion. On the other hand, the external base region 30 has the impurity concentration of above $1\times10^{19}$ cm⁻³, and it is possible to achieve a low resistance external base region.

In FIG. 2(e), ion implantation of B⁻ or H⁻ is conducted using photoresist as a mask to make the unrequired portion of the external base region 30 insulating, and an insulating region 31 having a depth of about 10000 angstroms is produced. This insulating region reduces parasitic capacitances.

In FIG. 2(f), after removing the photoresist, an insulating film 32 is deposited on the entire surface of the emitter electrode 27 by ECR CVD to flatten the surface. Sputtering is conducted in the ECR CVD apparatus using Ar gas while monitoring the thickness of the insulating film 32, thereby flattening the upper surface 31 and exposing the emitter electrode 27.

In FIG. 2(g), a desired portion of the insulating film 32 which is flattened using the photoresist as a mask is removed by RIE, and a p type ohmic electrode (base electrode) 33 is produced by evaporation and condensation of the electrode metals and removal of the excess electrode metals by lift-off.

This base electrode 33 is sintered using an alloy such as AuZn at a temperature of 450° C. for two minutes.

Since the impurity concentration of the external base region 30 at the surface is as high as $2\times10^{19}$ cm⁻³, a low contact resistance can be obtained even if a non-alloying ohmic electrode such as Ti/Mo/Au deposited in that order is employed as the base electrode.

Next, as shown in FIG. 1, a low resistance metal 34 such as Ti/Au is deposited on the emitter electrode 27 by evaporation and lift-off. This low resistance metal reduces the resistance of the emitter electrode.

In this embodiment, the refractory metal emitter electrode of refractory metal can be precisely patterned with high uniformity and high reproducibility by selective etching of n⁺ type InGaAs layer. An ohmic contact to the emitter electrode can be realized without alloying the refractory metal. Since p type dopants are selectively diffused using the refractory metal as a mask thereby to self-aligningly produce an external base region having a high impurity concentration, the external base resistance can be reduced, and the uniformity and reproducibility of a high performance HBT can be enhanced. Since the surface flattening and exposure of the emitter electrode are carried out in an ECR CVD process, a low resistance metal can be deposited on the refractory metal emitter with high reproducibility. In addition, element performance is enhanced by a reduction in the emitter resistance. The wiring process can be simplified by the flattening and enhancing integration density.

Figure 4:
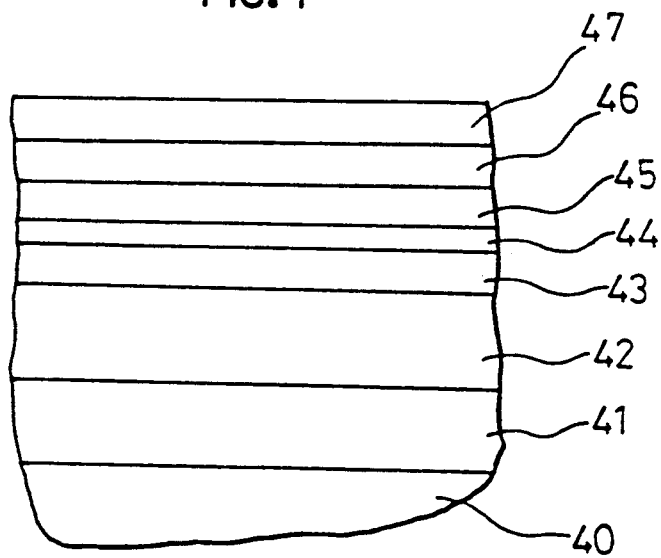
FIG. 4 is a cross-sectional view of an epitaxial growth structure another embodiment of the present invention.

While in the above-illustrated embodiment a GaAs series HBT utilizing a semi-insulating GaAs substrate is described, the present invention may be also applied to an InP series HBT utilizing an InP substrate. The epitaxial growth structure of the InP series HBT is shown in FIG. 4. In FIG. 4, reference numeral 40 designates a semi-insulating InP substrate. An n⁻ type InGaAs sub-collector layer 41 having a thickness of about 7000 angstroms and impurity concentration of about $1\times10^{19}$ cm⁻³ is disposed on the substrate 40. An n type InGaAs sub-collector layer 42 of about 6000 angstroms thickness is disposed on the sub-collector layer 41. A p⁻ type InGaAs base layer 43 having a thickness of about 1000 angstroms and impurity concentration of about $1\times10^{19}$ cm⁻³ is disposed on the sub-collector layer 42. An n type InGaAs spacer layer 44 having a thickness of about 200 angstroms and impurity concentration of about $5\times10^{17}$ cm⁻³ is disposed on the base layer 43. An n type InAlAs emitter layer 45 having a thickness of 1500 angstroms and impurity concentration of about $5\times10^{17}$ cm⁻³ is disposed on the spacer layer 44. An n⁻ type InAlAs second cap layer 46 having a thickness of about 1000 angstroms and impurity concentration of about $1\times10^{19}$ cm⁻³ is disposed on the emitter layer 45. An n⁻ type InGaAs first cap layer 47 having a thickness of about 1500 angstroms and impurity concentration of about $1 \times 10^{19}$ cm$^{-3}$ is disposed on the second cap layer 46.

While in the above-illustrated embodiment a solid phase diffusion is realized by annealing with heat using a doped oxide to produce an external base region, a method in which annealing by heating with infrared lamps is conducted after depositing a film by sputtering, an open tube method in which diffusion from Zn vapor or another diffusion method may be employed.

The epitaxial growth structure is, of course, not restricted to the structure of FIG. 1(a).

As is evident from the foregoing description, according to the present invention, an n$^-$ type InGaAs layer is produced at an upper surface of the device and an emitter electrode of a refractory metal is produced by selective etching of this InGaAs layer. Therefore, the emitter electrode can be precisely patterned with uniformity and high reproducibility.

Since diffusion of a p type dopant is self-aligned with using the emitter electrode as a mask thereby to produce a high impurity concentration external base region, the external base resistance can be reduced and a high performance HBT is obtained with uniformity and high reproducibility.

Since the layer flattening and exposure of the layer emitter electrode is carried out in an ECR CVD process, a low resistance metal can be deposited on a refractory metal emitter electrode with high reproducibility. Therefore, the emitter resistance can be reduced, thereby enhancing element performance.

Furthermore, because of the flattening and exposure of the emitter electrode in the ECR CVD process, the later processes such as wiring can be simplified, thereby resulting in a variety of effects enhancing integration density.

What is claimed is:

1. A heterojunction bipolar transistor comprising:
   a n type semiconductor collector;
   a p type semiconductor base layer having generally opposed first and second surfaces, the first surface being disposed on the collector, the base layer forming a heterojunction with the collector;
   an n type semiconductor emitter disposed within the base spaced from the first surface and reaching and accessible at the second surface;
   a n$^-$ type InGaAs cap layer disposed on the emitter at the second surface;
   a refractory metal emitter electrode disposed on and making ohmic contact to the cap layer without alloying; and
   a metal base contact disposed on the second surface electrically contacting the base layer and electrically insulated from the emitter electrode and cap layer.

2. The transistor of claim 1 wherein the collector is GaAs and the base layer and emitter are AlGaAs.

3. The transistor of claim 2 including a first Al$_x$Ga$_{1-x}$As layer in the emitter adjacent the base layer, a second Al$_y$Ga$_{1-y}$As layer in the emitter adjacent the cap layer, and an In$_z$Ga$_{1-z}$As layer in the cap layer adjacent the emitter.

4. The transistor of claim 1 wherein the collector and base layer are InGaAs and the emitter is InAlAs.

5. The transistor of claim 1 wherein the refractory metal is selected from the group consisting of tungsten and tungsten silicide.

6. The transistor of claim 1 wherein the emitter is self-aligned relative to the emitter electrode.

7. A heterojunction bipolar transistor comprising:
   a n type semiconductor collector;
   a p type semiconductor base layer having generally opposed first and second surfaces, the first surface being disposed on the collector, the base layer forming a heterojunction with the collector;
   an electrically insulating layer disposed on the collector, generally peripherally surrounding the base layer, and extending to the second surface;
   an n type semiconductor emitter disposed within the base spaced from the first surface and reaching and accessible at the second surface;
   a n$^-$ type InGaAs cap layer disposed on the emitter at the second surface;
   a refractory metal emitter electrode disposed on and making ohmic contact to the cap layer without alloying; and
   a metal base contact disposed on the second surface electrically contacting the base layer and electrically insulated from the emitter electrode and cap layer.

8. The transistor of claim 7 wherein the collector is GaAs and the base layer and emitter are AlGaAs.

9. The transistor of claim 8 including a first Al$_x$Ga$_{1-x}$As layer in the emitter adjacent the base layer, a second Al$_y$Ga$_{1-y}$As layer in the emitter adjacent the cap layer, and an In$_z$Ga$_{1-z}$As layer in the cap layer adjacent the emitter.

10. The transistor of claim 7 wherein the collector and base layer are InGaAs and the emitter is InAlAs.

11. The transistor of claim 7 wherein the refractory metal is selected from the group consisting of tungsten and tungsten silicide.

12. The transistor of claim 7 wherein the emitter is self-aligned relative to the emitter electrode.

13. The transistor of claim 7 wherein the electrically insulating layer comprises a semiconductor material containing implanted impurities selected from the group consisting of hydrogen ions and boron ions, making the semiconductor material electrically insulating.

* * * * *